(12) United States Patent
Ichiyama et al.

(10) Patent No.: US 7,715,512 B2
(45) Date of Patent: May 11, 2010

(54) JITTER MEASUREMENT APPARATUS, JITTER MEASUREMENT METHOD, AND RECORDING MEDIUM

(75) Inventors: Kiyotaka Ichiyama, Tokyo (JP); Masahiro Ishida, Tokyo (JP); Takahiro Yamaguchi, Tokyo (JP)

(73) Assignee: Advantest Corporation, Tokyo (JP)

( * ) Notice: Subject to any disclaimer, the term of this patent is extended or adjusted under 35 U.S.C. 154(b) by 843 days.

(21) Appl. No.: 11/535,279

(22) Filed: Sep. 26, 2006

(65) Prior Publication Data

US 2008/0077342 A1    Mar. 27, 2008

(51) Int. Cl.
    H04L 7/00    (2006.01)
    H04L 25/00   (2006.01)
    H04L 25/40   (2006.01)
(52) U.S. Cl. .......................... 375/371; 702/69
(58) Field of Classification Search .......... 375/224, 375/226, 371; 370/516; 702/69
    See application file for complete search history.

(56) References Cited

U.S. PATENT DOCUMENTS

| | | | | |
|---|---|---|---|---|
| 4,926,447 A | * | 5/1990 | Corsetto et al. | 375/376 |
| 5,245,636 A | * | 9/1993 | Sari et al. | 375/372 |
| 6,111,532 A | * | 8/2000 | Hirano et al. | 341/143 |
| 6,285,722 B1 | * | 9/2001 | Banwell et al. | 375/354 |
| 6,291,979 B1 | * | 9/2001 | Soma et al. | 324/76.82 |
| 6,460,001 B1 | * | 10/2002 | Yamaguchi et al. | 702/69 |
| 6,621,860 B1 | * | 9/2003 | Yamaguchi et al. | 375/226 |
| 6,775,321 B1 | * | 8/2004 | Soma et al. | 375/226 |
| 7,248,981 B2 | * | 7/2007 | Mochizuki | 702/69 |
| 7,397,847 B2 | * | 7/2008 | Ishida et al. | 375/226 |
| 2007/0201595 A1 | * | 8/2007 | Stimple et al. | 375/376 |
| 2008/0072130 A1 | * | 3/2008 | Stimple et al. | 714/798 |

FOREIGN PATENT DOCUMENTS

| | | |
|---|---|---|
| JP | H04-137839 | 5/1992 |
| JP | 2005233946 | 9/2005 |
| JP | 2005268848 | 9/2005 |
| WO | WO 02069555 | 9/2002 |

OTHER PUBLICATIONS

International Search Authority / JP. PCT International Search Report. International Application No. PCT/JP2007/067789. International Filing Date: Sep. 13, 2007. Japanese Language. 7 pages.

International Search Authority / JP. Partial English Translation of Japanese Language PCT International Search Report electronically filed on May 1, 2008. International Application No. PCT/JP2007/067789. International Filing Date Sep. 12, 2007. Form PCT/ISA/237. 4 pages.

* cited by examiner

*Primary Examiner*—Jean B Corrielus
(74) *Attorney, Agent, or Firm*—Sterne, Kessler, Goldstein & Fox P.L.L.C.

(57) ABSTRACT

A jitter measurement apparatus measures a jitter of a data signal having a substantially constant data rate. The jitter measurement apparatus includes therein a signal converting section that generates a clock signal based on the data signal, where the clock signal retains timings of data transition edges of the data signal at which a data value of the data signal transits and has edges whose cycle is substantially equal to the data rate, an analytic signal generating section that generates an analytic signal represented by a complex number based on the clock signal, and a jitter measuring section that measures the jitter of the data signal based on the analytic signal.

12 Claims, 14 Drawing Sheets

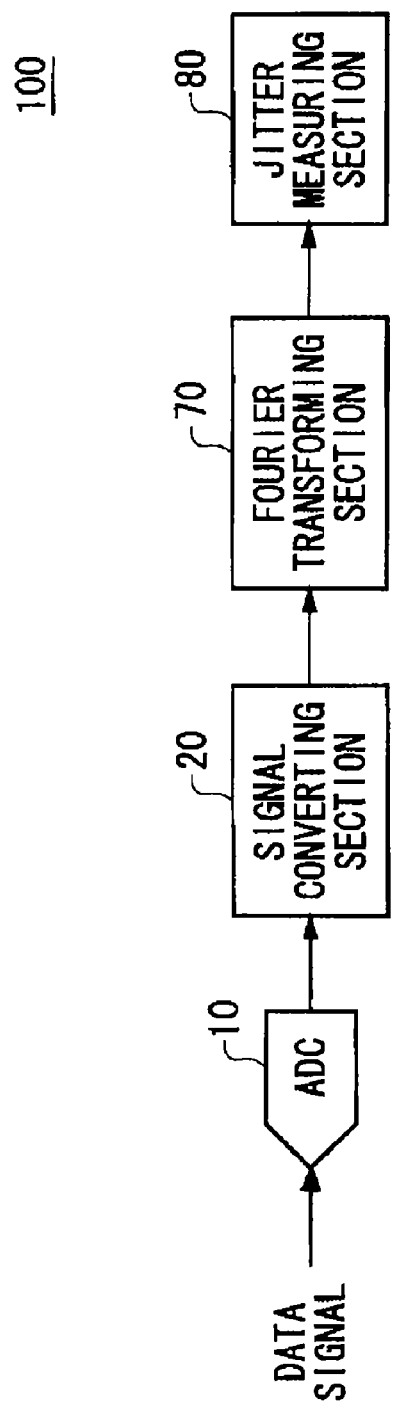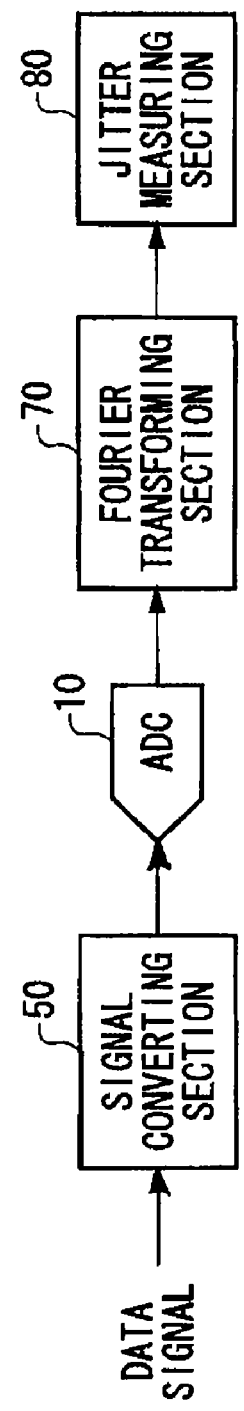
FIG. 12A
FIG. 12B

JITTER MEASUREMENT APPARATUS, JITTER MEASUREMENT METHOD, AND RECORDING MEDIUM

BACKGROUND

1. Field of the Invention

The present invention relates to a jitter measurement apparatus, a jitter measurement method, and a recording medium. The present invention particularly relates to a jitter measurement apparatus for measuring a jitter of a data signal having a substantially constant data rate.

2. Related Art

To measure a jitter of a data signal, which does not have constant intervals between data transitions, based on digital signal processing, a zero-crossing method can be used, which detects a timing at which the data signal crosses a 50% level (for example, a zero level) and measures a jitter of the data signal on the basis of the timing variation.

According to the zero-crossing method, the data signal is digitized at a predetermined sampling rate, and the zero-crossing timings of the data signal are detected based on the discrete values. Therefore, the measurement accuracy is dependent on how accurately the discrete values represent the zero-crossing timings (edge timings) of the data signal when the zero-crossing method is employed.

Considering this, the data signal needs to be digitized at a sampling rate which is sufficiently higher than the data rate of the data signal in order to measure the jitter of the data signal highly accurately by using the zero-crossing method. This means that the cost required for measuring the jitter of the data signal is driven up when high accuracy is desired with the use of the zero-crossing method.

SUMMARY

An advantage of some aspects of the present invention is to provide a jitter measurement apparatus, a jitter measurement method, and a recording medium which can solve the above-mentioned problem. This objective is achieved by combining the features recited in the independent claims. The dependent claims define further effective specific example of the present invention.

A first embodiment of the invention provides a jitter measurement apparatus for measuring a jitter of a data signal having a substantially constant data rate. The jitter measurement apparatus includes a signal converting section that generates a clock signal based on the data signal, where the clock signal retains timings of data transition edges of the data signal at which a data value of the data signal transits and has edges whose cycle is substantially equal to the data rate, an analytic signal generating section that generates an analytic signal represented by a complex number from the clock signal, and a jitter measuring section that measures the jitter of the data signal based on the analytic signal.

A second embodiment of the invention provides a jitter measurement apparatus for measuring a jitter of a data signal having a substantially constant data rate. The jitter measurement apparatus includes a signal converting section that generates a clock signal based on the data signal. where the clock signal retains timings of data transition edges of the data signal at which a data value of the data signal transits and has edges whose cycle is substantially equal to the data rate, a Fourier transforming section that transforms the clock signal into a frequency-domain spectrum. and a jitter measuring section that measures the jitter of the data signal based on a ratio of a signal component to noise components of the clock signal in the spectrum.

A third embodiment of the invention provides a jitter measurement method for measuring a jitter of a data signal having a substantially constant data rate. The jitter measurement method includes generating a clock signal based on the data signal, where the clock signal retains timings of data transition edges of the data signal at which a data value of the data signal transits and has edges whose cycle is substantially equal to the data rate, generating an analytic signal represented by a complex number based on the clock signal, and measuring the jitter of the data signal based on the analytic signal.

A fourth embodiment of the invention provides a jitter measurement method for measuring a jitter of a data signal having a substantially constant data rate. The jitter measurement method includes generating a clock signal based on the data signal, where the clock signal retains timings of data transition edges of the data signal at which a data value of the data signal transits and has edges whose cycle is substantially equal to the data rate, transforming the clock signal into a frequency-domain spectrum. and measuring the jitter of the data signal based on a ratio of a signal component to noise components of the clock signal in the spectrum.

A fifth embodiment of the invention provides a recording medium storing thereon a program that causes a computer to function as a jitter measurement apparatus for measuring a jitter of a data signal having a substantially constant data rate. Here, the program causes the computer to function as a signal convening section that generates a clock signal based on the data signal, where the clock signal maintains timings of data transition edges of the data signal at which a data value of the data signal transits and has edges whose cycle is substantially equal to the data rate, an analytic signal generating section that generates an analytic signal represented by a complex number from the clock signal, and a jitter measuring section that measures the jitter of the data signal based on the analytic signal.

A sixth embodiment of the invention provides a recording medium storing thereon a program that causes a computer to function as a jitter measurement apparatus for measuring a jitter of a data signal having a substantially constant data rate. Here, the program causes the computer to function as a signal convening section that generates a clock signal based on the data signal, where the clock signal retains timings of data transition edges of the data signal at which a data value of the data signal transits and has edges whose cycle is substantially equal to the data rate, a Fourier transforming section that transforms the clock signal into a frequency-domain spectrum. and a jitter measuring section that measures the jitter of the data signal based on a ratio of a signal component to noise components of the clock signal in the spectrum.

Here, all the necessary features of the present invention are not listed in the summary. The sub-combinations of the features may become the invention.

BRIEF DESCRIPTION OF THE DRAWINGS

FIG. 12A shows another example of the configuration of the jitter measurement apparatus 100.

FIG. 12B shows another example of the configuration of the jitter measurement apparatus 100.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
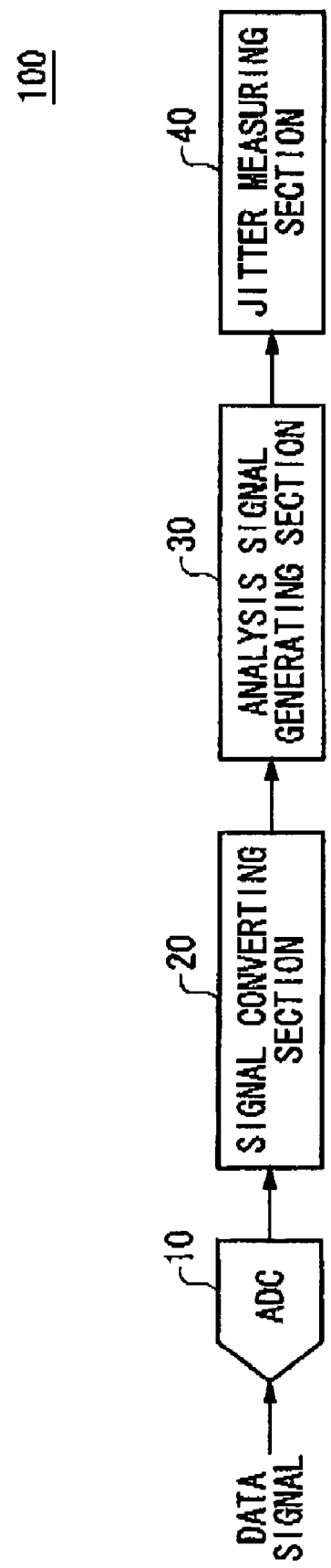
FIG. 1 shows an example of the configuration of a jitter measurement apparatus 100 relating to an embodiment of the invention.

FIG. 1 shows an example of the configuration of a jitter measurement apparatus 100 relating to an embodiment of the invention. The jitter measurement apparatus 100 is used for measuring a jitter of a data signal having a substantially constant data rate. The jitter measurement apparatus 100 includes therein an AD converter 10, a signal converting section 20, an analytic signal generating section 30 and a jitter measuring section 40. Note that the jitter measurement apparatus 100 measures the jitter of the data signal based on digital signal processing.

The AD converter 10 digitizes the level of the digital signal at a predetermined sampling rate to obtain a digitized signal, and inputs the digitized signal into the signal converting section. The AD converter 10 may digitize the data signal at a sampling rate which is twice or more as high as the data rate of the data signal. Alternatively, the jitter measurement apparatus 100 may not include therein the AD converter 10, and instead receive a digitized signal which is in advance obtained by digitizing the data signal.

The signal converting section 20 receives the data signal and generates a clock signal based thereon. Here, the signal converting section 20 generates the clock signal based on the digitized signal obtained from the data signal. It should be noted that the clock signal generated by the signal converting section 20 maintains the timings of data transition edges of the data signal under test at which the data value of the data signal transits, and has edges whose cycle is substantially equal to the data rate of the data signal.

According to the present embodiment, the signal converting section 20 generates the clock signal by providing a virtual edge at one or more boundaries of the data rate in the data signal at which the data value does not transit. An example of the configuration of the signal converting section 20 is later described with reference to FIGS. 3 and 4.

The data rate of the data signal may be given to the signal converting section 20 in advance, or obtained by the signal converting section 20 based on the digitized signal. For example, the signal converting section 20 may calculate a spectrum of the digitized signal, and obtain the data rate of the data signal on the basis of the peak frequency of the spectrum.

The analytic signal generating section 30 generates, based on the clock signal output from the signal converting section 20, an analytic signal that can be represented by a complex number. For example, the analytic signal generated by the analytic signal generating section 30 may have the clock signal as the real part and a Hilbert transform of the clock signal as the imaginary part. An example of the configuration of the analytic signal generating section 30 is later described with reference to FIG. 5.

The jitter measuring section 40 measures the jitter of the data signal based on the analytic signal. An example of the configuration of the jitter measuring section 40 is later described with reference to FIG. 7. The jitter measuring section 40 calculates an instantaneous phase of the data signal from the analytic signal, and measures the timing jitter of the data signal from the instantaneous phase.

The jitter measurement apparatus 100 relating to the present embodiment can generate the analytic signal based on the data signal, by generating a clock signal based on the data signal, and measuring the jitter of the data signal from the analytic signal. Therefore, the jitter measurement apparatus 100 does not require the timings of the data transition edges of the data signal to be highly accurately detected in order to measure the jitter of the data signal. This means that the jitter measurement apparatus 100 can accurately measure the jitter of the data signal even when the data signal is digitized at a low sampling rate.

Figure 2A:
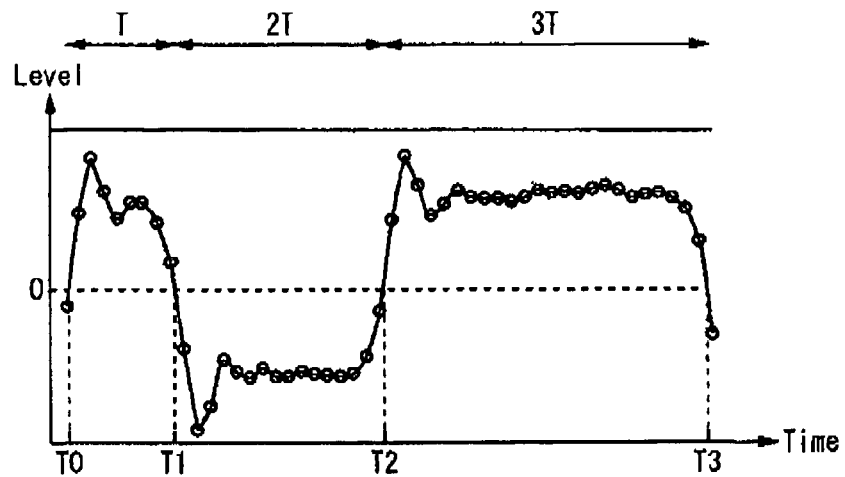
FIG. 2A shows an example of the operation performed by an AD converter 10.

FIG. 2A shows an example of an operation performed by the AD converter 10. As mentioned above, the AD converter 10 converts the data signal which is indicated by the solid line in FIGS. 2A to 2C into the digitized signal which is indicated by the circles in FIGS. 2A to 2C.

Figure 2B:
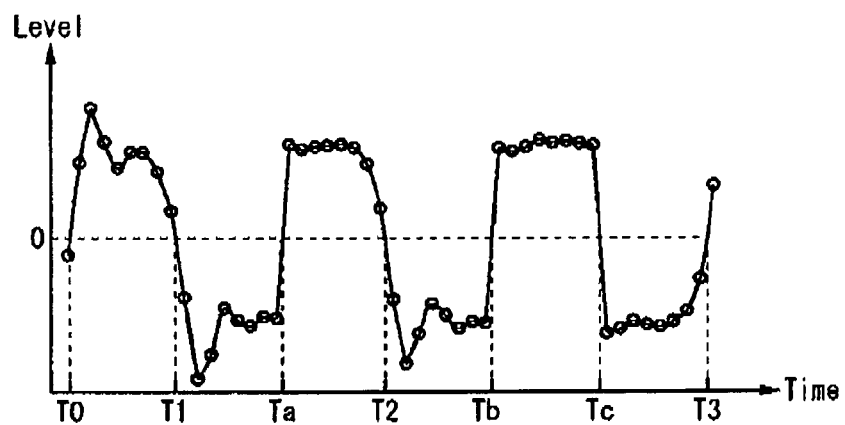
FIG. 2B shows an example of the operation performed by a signal converting section 20.

FIG. 2B shows an example of the operation performed by the signal converting section 20. As mentioned above, the signal converting section 20 generates the clock signal that keeps the timings (T0, T1, T2 and T3) of the data transition edges of the data signal under test shown in FIG. 2A and has edges at timings (T0, T1, Ta, T2, Tb, Tc and T3) which substantially coincide with the boundaries of the data rate in the data signal. For example, the signal converting section 20 measures the intervals (for example, T, 2T and 3T in FIG. 2A) between the timings of the data transition edges (T0, T1, T2 and T3), and compares the intervals between the data transition edges with the data rate of the data signal. If any of the intervals between the data transition edges is larger than the data rate by a predetermined value or more, one or more virtual edges are inserted between the data transition edges, for example.

Figure 2C:
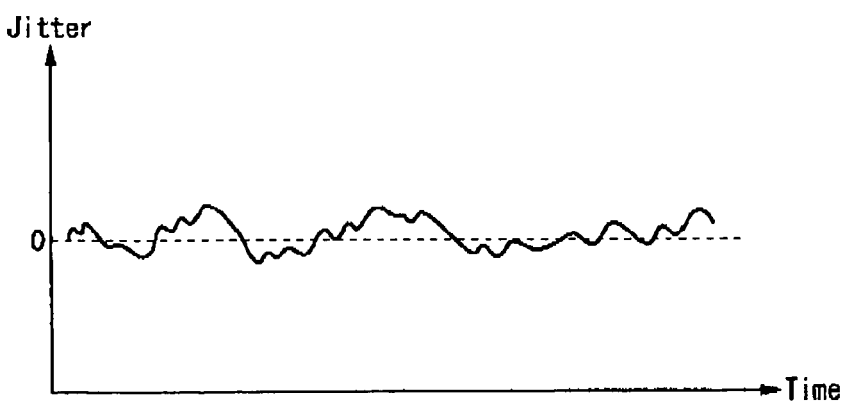
FIG. 2C shows an example of the operation performed by a jitter measuring section 40.

FIG. 2C shows an example of the operation performed by the jitter measuring section 40. As mentioned above, the jitter measuring section 40 calculates the instantaneous phase of the clock signal on the basis of the analytic signal supplied from the analytic signal generating section 30. The jitter measuring section 40 then calculates an instantaneous phase noise of the clock signal by removing a linear component from the instantaneous phase. FIG. 2C shows an example of the instantaneous phase noise calculated by the jitter measuring section 40. Here, the timing jitter of the data transition edges of the data signal can be measured by sampling the instantaneous phase noise at the timings of the data transition edges of the data signal (T0, T1, T2 and T3).

Figure 3:
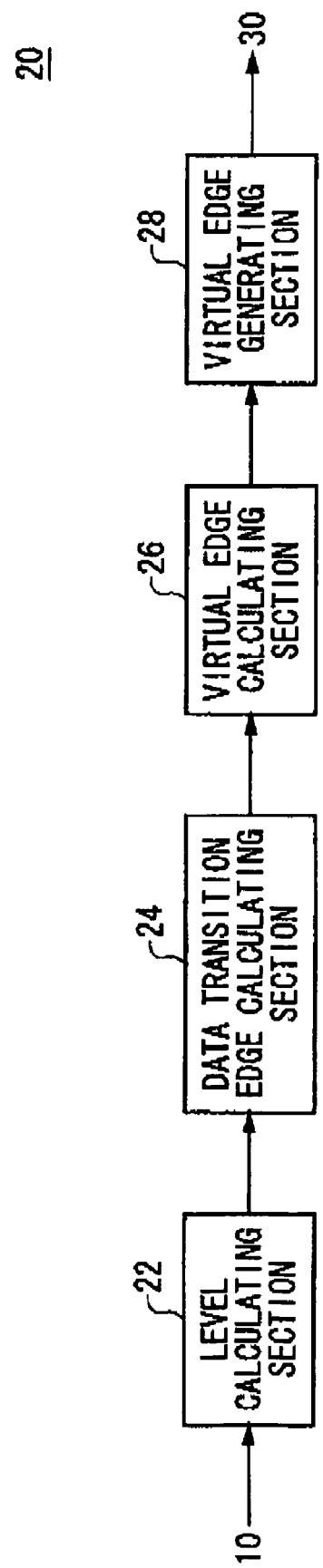
FIG. 3 shows an example of the configuration of the signal converting section 20.

FIG. 3 shows an example of the configuration of the signal converting section 20. The signal converting section 20 includes therein a level calculating section 22, a data transition edge calculating section 24, a virtual edge calculating section 26 and a virtual edge generating section 28.

Figure 4:
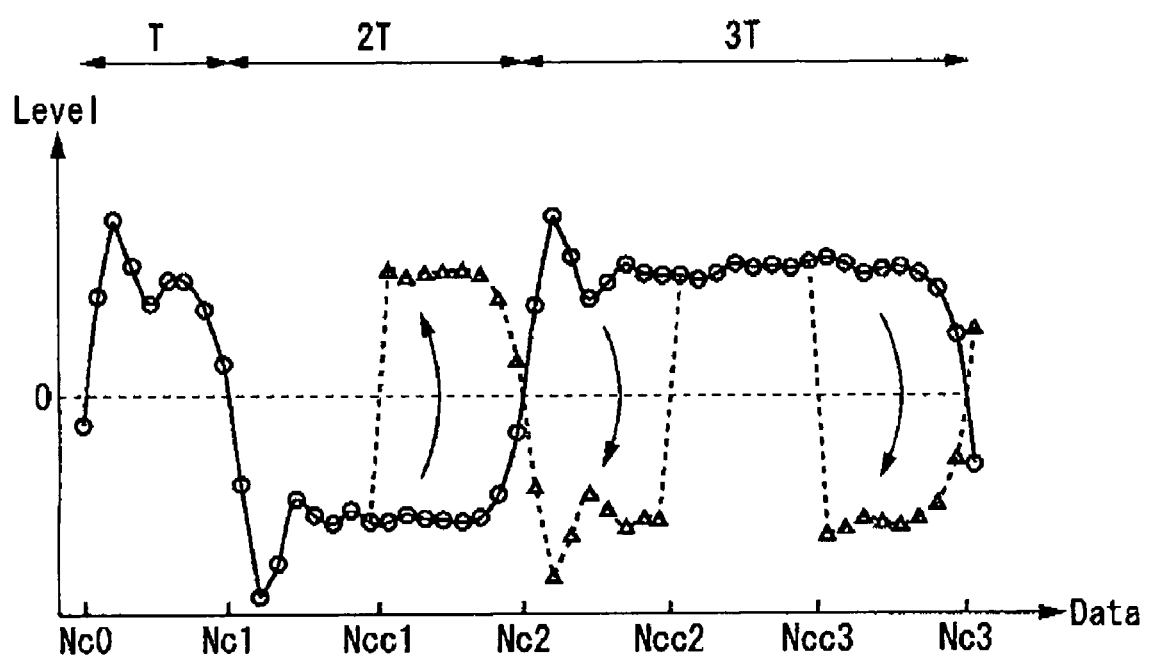
FIG. 4 shows an example of the operation performed by the signal converting section 20.

FIG. 4 shows an example of the operation performed by the signal converting section 20. To start with, the level calculating section 22 calculates a reference level of the data signal. Here, the reference level of the data signal may be an average level between the H level of the data signal (100% level of the data signal) and the L level (0% level of the data signal). In other words, the reference level of the data signal is substantially equal to the 50% level of the H level of the data signal. As the reference level, the level calculating section 22 may calculate an average value between the discrete values of the data signal. In this case, the level calculating section 22 may preferably calculate the average value from a sufficiently large number of discrete values. Alternatively, the level calculating section 22 may calculate, as the reference level, an average value between discrete values of a reference data signal including pieces of data indicating the H level and pieces of data indicating the L level, where the number of the H-level data substantially equals to that of the L-level data. As another alternative, the reference level may be designated by a user or the like in advance. As another alternative, the level calculating section 22 may set the zero level as the reference level. According to the present embodiment, the level calculating section 22 calculates the zero level as the reference level.

The data transition edge calculating section 24 calculates data numbers (Nc0, Nc1, Nc2 and Nc3) which data values are associated with each transition, based on the digitized signal indicated by the circles in FIG. 4. To be specific, the data transition edge calculating section 24 detects a data number by checking change in data values with respect to the reference level of the data signal. According to the present embodiment, the data transition edge calculating section 24 detects a data number associated with a data value the sign of which is different from the sign of its immediately preceding data value.

The data transition edge calculating section 24 may detect a data number which is expressed by an integer. Alternatively, the data transition edge calculating section 24 may further calculate a data number which is expressed by a real number, based on the detected data number of an integer. To calculate the data number expressed by a real number, the AD converter 10 converts the data signal into a digitized signal having three or more types of discrete values. Furthermore, the data transition edge calculating section 24 linearly interpolates two pieces of data, in the digitized signal, between which the data value transits, and calculates a timing at which the linear line crosses the reference level.

The virtual edge calculating section 26 and virtual edge generating section 28 generate the clock signal, which has one or more virtual edges provided at substantially constant intervals determined in accordance with the data rate in the interval between data transition edges of the data signal whose interval is larger than a predetermined value. According to the present embodiment, one or more virtual edges are inserted into the interval between data transition edges whose interval is 1.5 times or more as large as the data rate. Furthermore, the number of bits, in the data signal, which correspond to the interval between the data transition edges is calculated to calculate the number of virtual edges to be inserted. According to the present embodiment, the virtual edge calculating section 26 calculates one or more timings at which the virtual edges are to be provided (Ncc1, Ncc2 and Ncc3), and the virtual edge generating section 28 generates the virtual edges at the calculated timings.

The virtual edge calculating section 26 calculates intervals between the data transition edges (Nc0-Nc1, Nc1-Nc2 and Nc2-Nc3), on the basis of the timings (data numbers) at which the data value transits which are calculated by the data transition edge calculating section 24, and calculates the number of virtual edges to be inserted into each of the intervals between the data transition edges.

For example, the virtual edge calculating section 26 divides, by the data rate, each of the calculated intervals between the edges, and rounds off the quotient to the nearest integer number. Then, the virtual edge calculating section 26 subtracts one from the calculation result, and sets the result of the subtraction as the number of virtual edges to be inserted into the interval. According to the present embodiment, with an assumption that the data rate of the data signal is T, the number of virtual edges to be inserted is zero for a first data transition edge interval (Nc0-Nc1), one for a second data transition edge interval (Ncc1-Nc2), and two for a third data transition edge interval (Nc2-Nc3).

Also, the virtual edge calculating section 26 calculates a timing for each virtual edge to be inserted such that the virtual edges are provided at substantially constant intervals in each data transition edge interval. This operation is explained in the following using examples. Since one virtual edge is to be inserted in the second data transition edge interval (Ncc1-Nc2), the virtual edge calculating section 26 calculates, as the timing of the virtual edge, a timing (Ncc1) which is located in substantially the middle between the two data transition edges (Nc1 and Nc2). Similarly, since two virtual edges are to be inserted in the third data transition edge interval (Nc2-Nc3), the virtual edge calculating section 26 calculates, as the timings of the two virtual edges, timings (Ncc2 and Ncc3) which are located so as to evenly divide the interval between the two data transition edges (Nc2 and Nc3) into three sections.

The virtual edge generating section 28 generates the virtual edges by inverting the data value of the digitized signal with respect to the reference level of the data signal, in accordance with the timings of the virtual edges calculated by the virtual edge calculating section 26. This operation is explained through an example shown in FIG. 4. The virtual edge generating section 28 may generate each virtual edge indicated by the dotted line, by replacing a portion of the digitized data indicated by the circles which ranges from an odd-numbered virtual edge timing to an even-numbered virtual edge timing, with the inverted data indicated by the triangles. Alternatively, the virtual edge generating section 28 may shift the level of the digitized signal so that the reference level of the digitized signal is substantially equal to zero, and then multiply with "−1" a portion of the digitized data which ranges from an odd-numbered virtual edge timing to an even-numbered virtual edge timing.

According to the above-described process, the virtual edge generating section 28 inverts the data, which ranges from an odd-numbered virtual edge timing to an even-numbered virtual edge timing. Conversely, however, the virtual edge generating section 28 may invert data, which ranges from an even-numbered virtual edge timing to an odd-numbered virtual edge timing.

By performing the above-described procedure, the signal converting section 20 can generate the clock signal based on the data signal. It should be noted that the inserted virtual edges linearly interpolate the data transition edges. Therefore, the jitter of the virtual edges hardly affects the jitter of the data transition edges under test.

Figure 5:
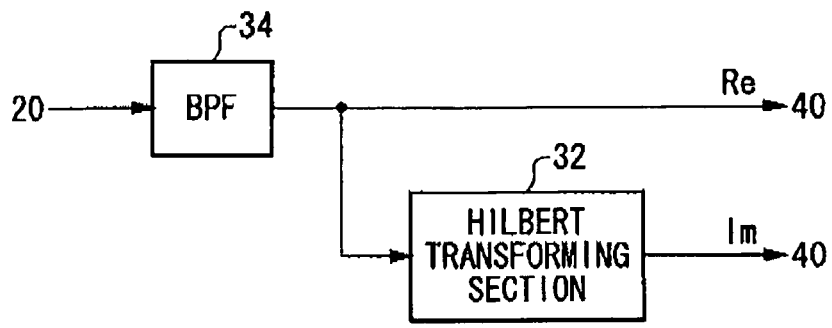
FIG. 5 shows an example of the configuration of an analytic signal generating section 30.

FIG. 5 shows an example of the configuration of the analytic signal generating section 30. According to the present embodiment, the analytic signal generating section 30 includes therein a Hilbert transforming section 32.

Figure 6:
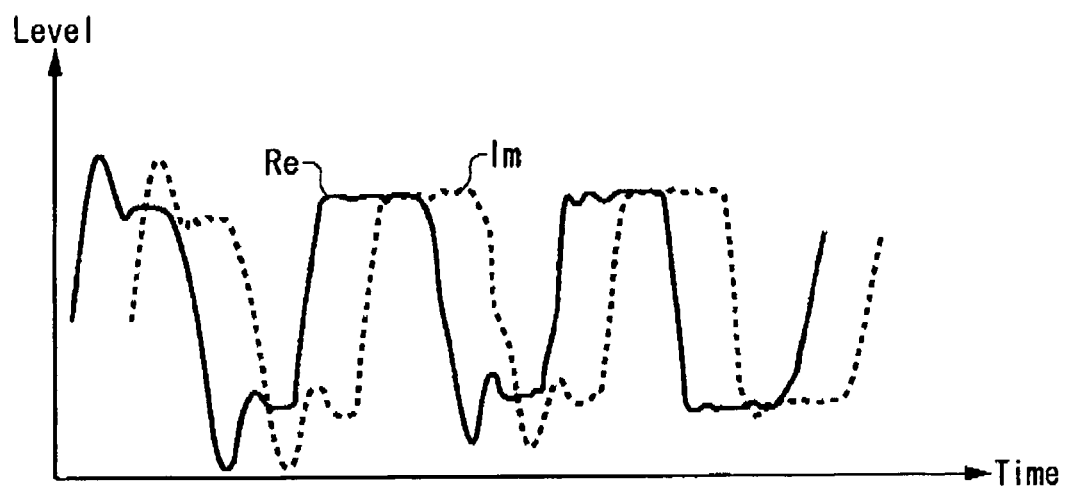
FIG. 6 shows an example of the operation performed by the analytic signal generating section 30.

FIG. 6 shows an example of the operation performed by the analytic signal generating section 30. The Hilbert transforming section 32 applies the Hilbert transforms to the clock signal output from the signal converting section 20. The analytic signal generating section 30 outputs the analytic signal having, as the real part, the clock signal output from the signal converting section 20 and, as the imaginary part, the signal output from the Hilbert transforming section 32. Since the clock signal generated by the signal converting section 20 keeps the timings of the data transition edges of the data signal, the analytic signal generated by the analytic signal generating section 30 can keep phase information of the data transition edges of the data signal under test.

The analytic signal generating section 30 may further include therein a filter 34 which passes a predetermined frequency component of the clock signal. For example, the filter 34 may pass a fundamental wave frequency component of the clock signal.

Here, the configuration of the analytic signal generating section 30 may not be limited to the configuration shown in FIG. 5. The analytic signal generating section 30 may take any of different configurations which enable an analytic signal to be generated which has, as the real part, the clock signal and, as the imaginary part, the Hilbert-transformed clock signal.

Figure 7:
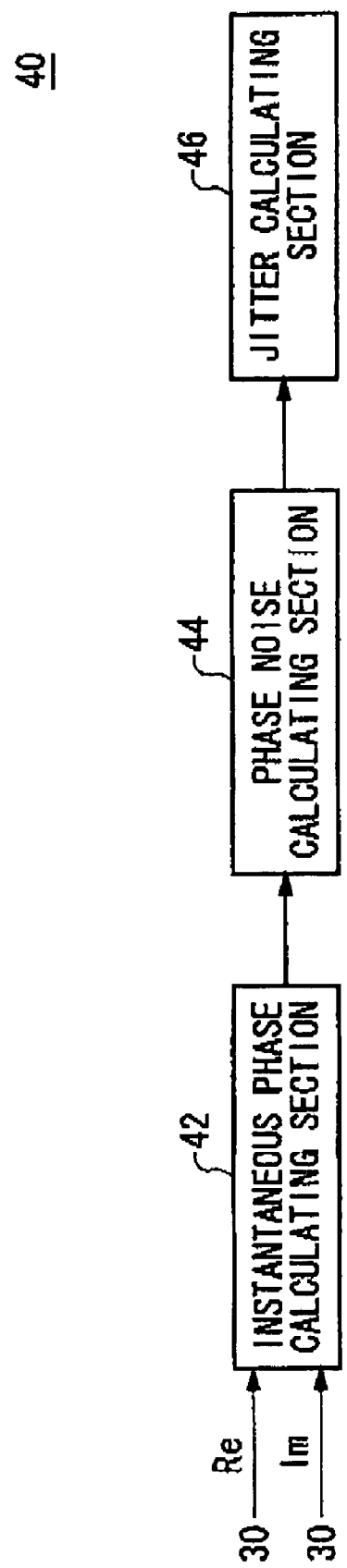
FIG. 7 shows an example of the configuration of the jitter measuring section 40

FIG. 7 shows an example of the configuration of the jitter measuring section 40. According to the present embodiment, the jitter measuring section 40 includes therein an instantaneous phase calculating section 42, a phase noise calculating section 44 and a jitter calculating section 46.

Figure 8A:
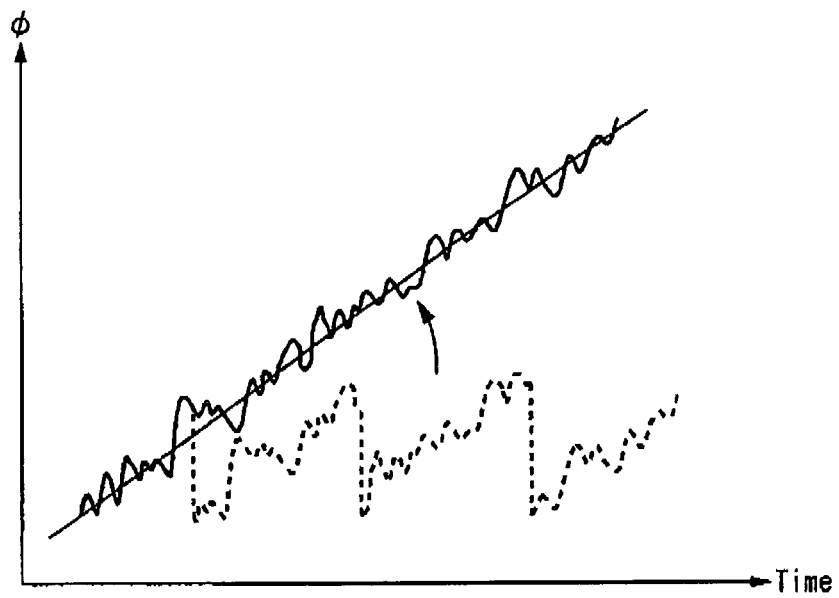
FIG. 8A shows, as an example, the operation performed by an instantaneous phase calculating section 42 and the operation performed by a phase noise calculating section 44.
Figure 8B:
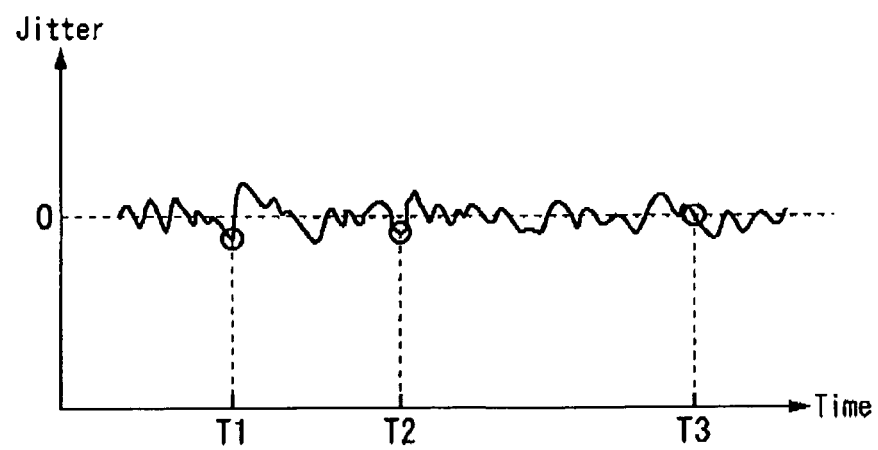
FIG. 8B shows an example of the operation performed by a jitter calculating section 46.

FIG. 8A shows, as an example, the operation performed by the instantaneous phase calculating section 42 and the operation performed by the phase noise calculating Section 44. The instantaneous phase calculating section 42 calculates instantaneous phases of the clock signal by calculating arc tangents from the real and imaginary parts of the analytic signal. The instantaneous phases are represented by principal values from $\pi$ to $\pi$, as indicated by the dotted line in FIG. 8A, for example. The instantaneous phase calculating section 42 unwraps a discontinuity in the instantaneous phases, to calculate continuous instantaneous phases indicated by the solid line in FIG. 8A. In other words, the instantaneous phase calculating section 42 calculates the continuous instantaneous phases by sequentially adding $2\pi$ to the discontinuous instantaneous phases in accordance with the cycle of the data signal.

The phase noise calculating section 44 removes a linear component from the continuous instantaneous phases calculated by the instantaneous phase calculating section 42. Here, the phase noise calculating section 44 may calculate the linear component which approximates the continuous instantaneous phases by means of a least-square method for example, and remove the linear component. Here, since the linear component corresponds to instantaneous phases observed when it is jitter free, a difference between the calculated instantaneous phases and the linear component corresponds to a phase noise component of the clock signal.

FIG. 5B shows an example of the operation performed by the jitter calculating section 46. The jitter calculating section 46 may sample the noise component calculated by the phase noise calculating section 44 at the timings (T1, T2 and T3) of the data transition edges of the data signal, and calculate the jitter at the data transition edges of the data signal on the basis of the result of the sampling. In this way, the jitter can be more accurately calculated.

Here, the jitter calculating section 46 may calculate a root mean square (RMS) or a peak-to-peak value of the timing jitter at the data transition edges of the data signal on the basis of the result of the sampling, for example.

Figure 9:
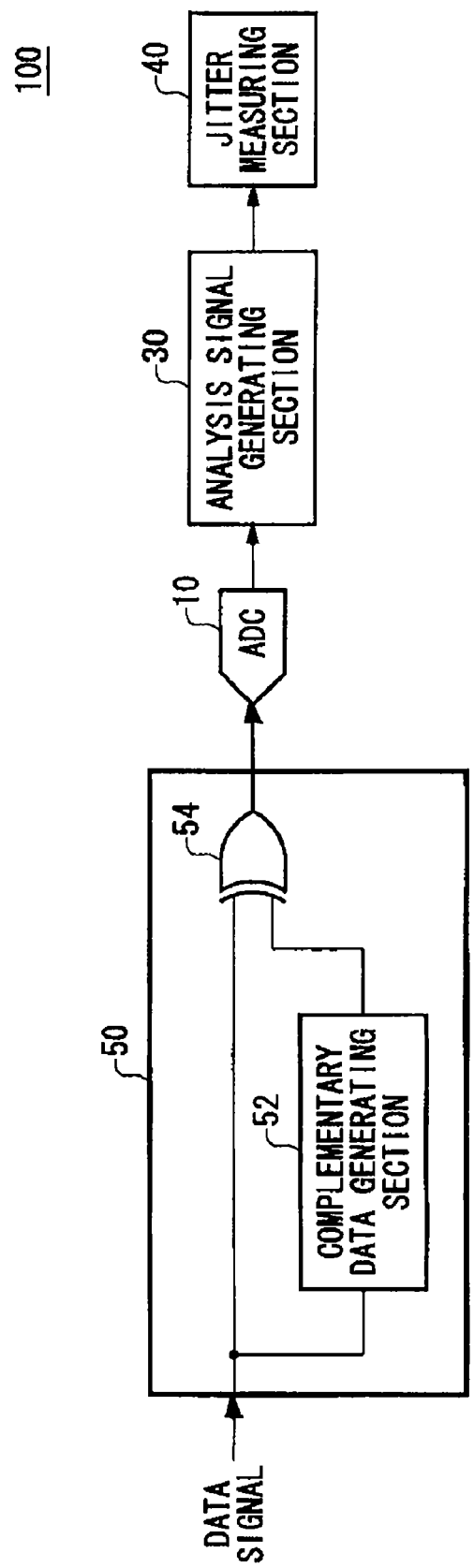
FIG. 9 shows another example of the configuration of the jitter measurement apparatus 100.

FIG. 9 shows another example of the configuration of the jitter measurement apparatus 100. According to this alternative embodiment, the jitter measurement apparatus 100 includes therein a signal converting section 50, the AD converter 10, the analytic signal generating section 30 and the jitter measuring section 40.

According to the jitter measurement apparatus 100 illustrated with reference to FIG. 1, the data signal is digitized by the AD converter 107 and then a clock signal is generated based on the signal digitized by the AD converter. According to the jitter measurement apparatus 100 relating to this alternative embodiment, on the other hand, the data signal is used to generate the clock signal, and the resulting clock signal is digitized by the AD converter 10. In this alternative embodiment, the configurations and operations of the analytic signal generating section 30 and jitter measuring section 40 are the same as in the embodiment illustrated with reference to FIG. 1.

The signal converting section 50 includes therein a complementary data generating section 52 and an exclusive OR circuit 54. The complementary data generating section 52 receives the data signal, and generates a complementary data signal for the received data signal. The complementary data signal is generated by providing an edge at a boundary of data intervals of the data signal, when a data transition edge of the data signal is not present at the boundary. For example, when the edges of the data signal and the edges of the complementary data signal are added together along the same time axis, the edges may be aligned with each other at substantially constant time intervals. Here, the data interval of the data signal may represent a time period during which each non-consecutive signal of data is held, when the data signal is serially transmitted. Alternatively, the data interval of the data signal may represent a time period during which symbol data is held, when the data signal is multiple-valued to be transmitted. Which is to say, the data interval of the data signal may be a bit interval or a symbol interval of the data signal.

The exclusive OR circuit 54 outputs an exclusive OR between the data signal and the complementary data signal. Here, the signal converting section 50 may additionally include therein a delay element for adjusting a skew between a time duration required for the received data signal to be input into the exclusive OR circuit 54, and a time duration required for the complementary data signal to be input into the exclusive OR circuit 54 after receiving the input data signal.

The above-described configuration also enables the clock signal to be generated based on the data signal.

Figure 10:
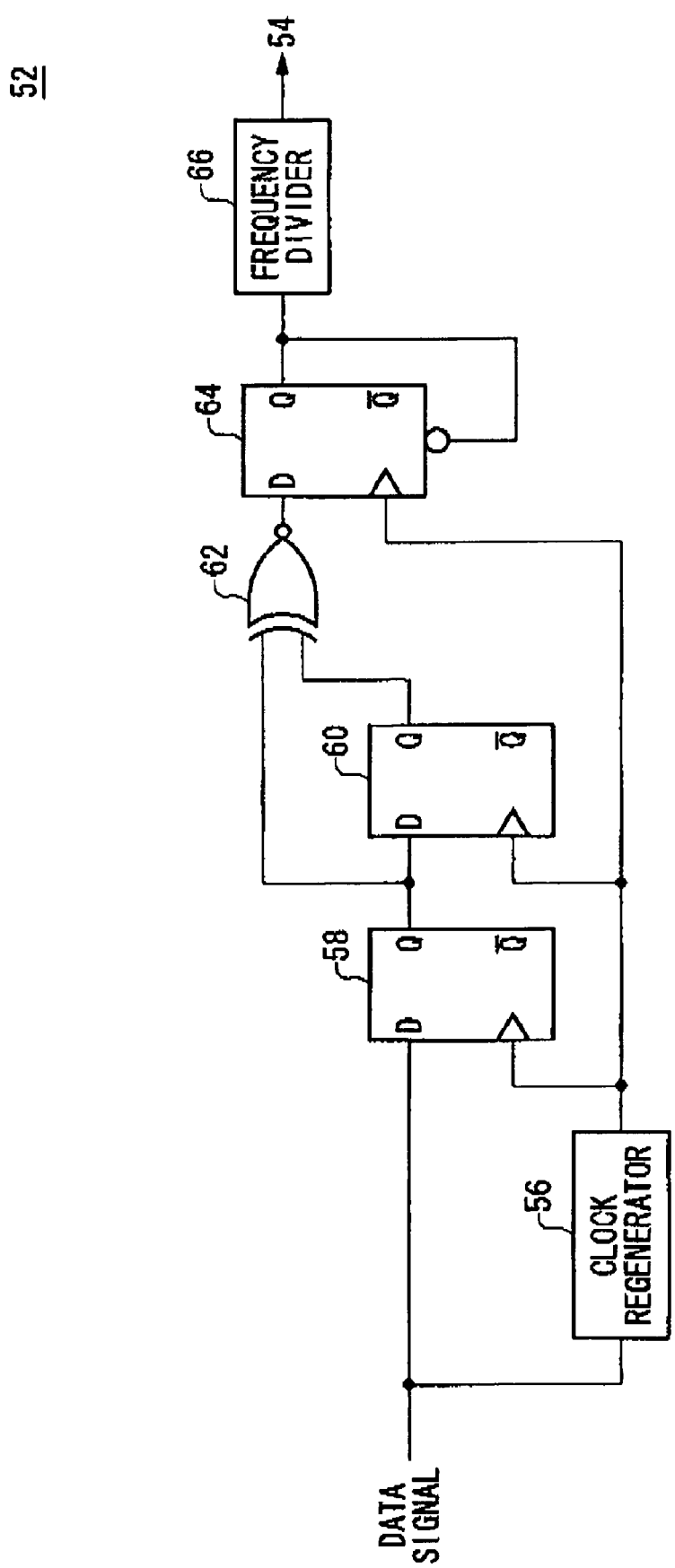
FIG. 10 shows an example of the configuration of a complementary data generating section 52.

FIG. 10 shows an example of the configuration of the complementary data generating section 52. The complementary data generating section 52 relating to the present embodiment includes therein a clock regenerator 56, a first D flip-flop 58, a second D flip-flop 60, a matching detector 62, a third D flip-flop 64, and a frequency divider 66.

Figure 11A:
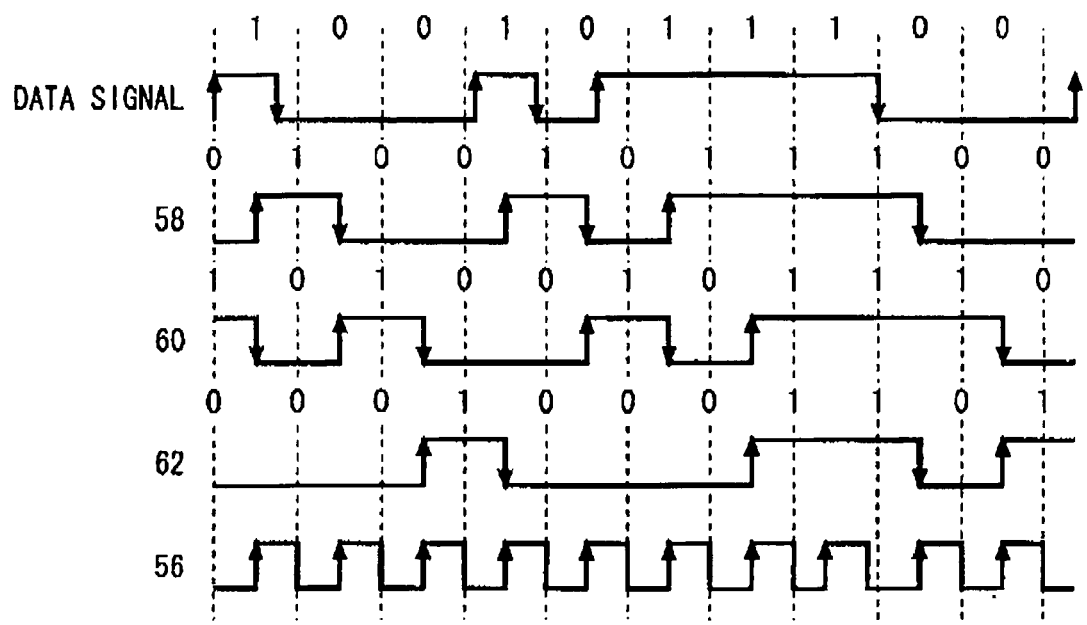
FIG. 11A shows an example of the operation performed between a clock regenerator 56 and a matching detector 62 in the complementary data generating section 52.
Figure 11B:
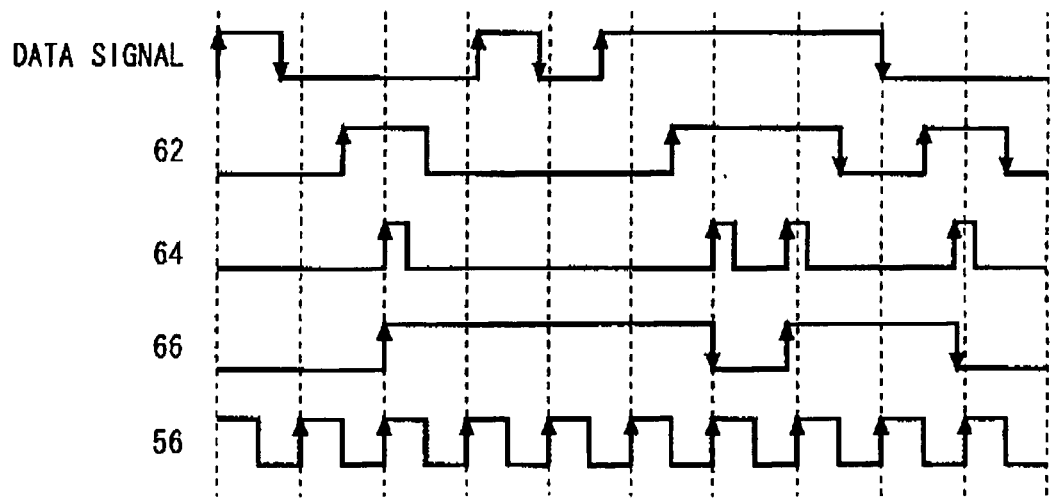
FIG. 11B shows an example of the operation performed between the matching detector 62 and a frequency divider 66 in the complementary data generating section 52.

FIG. 11A shows an example of the operation performed between the clock regenerator 56 and the coincident detector 62 in the complementary data generating section 52. FIG. 11B shows an example of the operation performed between the matching detector 62 and the frequency divider 66 in the complementary data generating section 52.

As shown in FIG. 11A, the clock regenerator 56 generates a periodic signal which has a cycle substantially the same as the data interval of the data signal, on the basis of the data signal. Here, the clock regenerator 56 may generate the periodic signal by means of a PLL circuit or the like.

The first D flip-flop 58 receives the data signal in accordance with the periodic signal, and outputs the received data signal. The second D flip-flop 60 receives the signal output from the first D flip-flop 58 at the edge of the periodic signal, and outputs the received signal. Which is to say, the second D flip-flop 60 delays the signal output from the first D flip-flop 58 by a time duration equal to one data interval of the data signal, and outputs the delayed signal.

The coincident detector 62 outputs a coincident signal indicating an H logic when the value of the signal output from the first D flip-flop 58 is coincident with the value of the signal output from the second D flip-flop 60.

As shown in FIG. 11B, the third D flip-flop 64 receives the signal output from the matching detector 62 in accordance with the periodic signal and outputs the received signal. Here, the output signal resets internal data. In other words, when receiving a rising edge of the periodic signal, the third D flip-flop 64 outputs a pulse having a pulse width shorter than the data interval of the data signal, under a condition that the signal received from the coincident detector 62 indicates a logical value "H".

The frequency divider 66 halves the frequency of the signal output from the third D flip-flop 64, to generate the complementary data signal. To be specific, by halving the frequency, the frequency divider 66 generates a signal the logical value of which changes in accordance with one of the rising and falling edges of the signal output from the third D flip-flop 64 as shown in FIG. 11B.

With the above-described configuration, the complementary data generating section 52 can easily generate the complementary data signal for the data signal.

FIG. 12A shows another example of the configuration of the jitter measurement apparatus 100. According to this alternative embodiment, the data measurement apparatus 100 includes therein the AD converter 10, the signal converting section 20, a Fourier transforming section 70, and a jitter measuring section 80. The AD converter 10 and signal converting section 20 are the same as the responding constituents shown in FIG. 1.

The Fourier transforming section 70 transforms the clock signal output from the signal converting section 20 into a frequency-domain spectrum. Since the clock signal generated by the signal converting section 20 keeps the timings of the data transition edges of the data signal, the spectrum generated by the Fourier transforming section 70 can retain jitter information of the data transition edges of the data signal.

The jitter measuring section 80 measures the jitter of the data signal on the basis of the ratio of a signal component to noise components of the clock signal in the spectrum obtained from the Fourier transforming section 70. For example, in the spectrum, the jitter measuring section 80 may detect, as the signal component, the frequency components corresponding to the data rate of the data signal and, as the noise components, predetermined frequency components. The predetermined frequencies may be set in advance in the jitter measuring section 80 in accordance with the frequencies of the jitter components to be measured.

The jitter measurement apparatus 100 having the above-described configuration can also measure the jitter with high accuracy even when the data signal is digitized at a low sampling rate.

FIG. 12B shows another example of the configuration of the jitter measurement apparatus 100. According to this alternative embodiment, the jitter measurement apparatus 100 includes therein the signal converting section 50, the AD converter 10, the Fourier transforming section 70, and the jitter measuring section 80. The signal converting section 50 and AD converter 10 are the same as the corresponding constituents in FIG. 9, and the Fourier transforming section 70 and jitter measuring section 80 are the same as the corresponding constituents in FIG. 12A. The jitter measurement apparatus 100 having this configuration can also measure the jitter with high accuracy even when the data signal is digitized at a low sampling rate.

Figure 13:
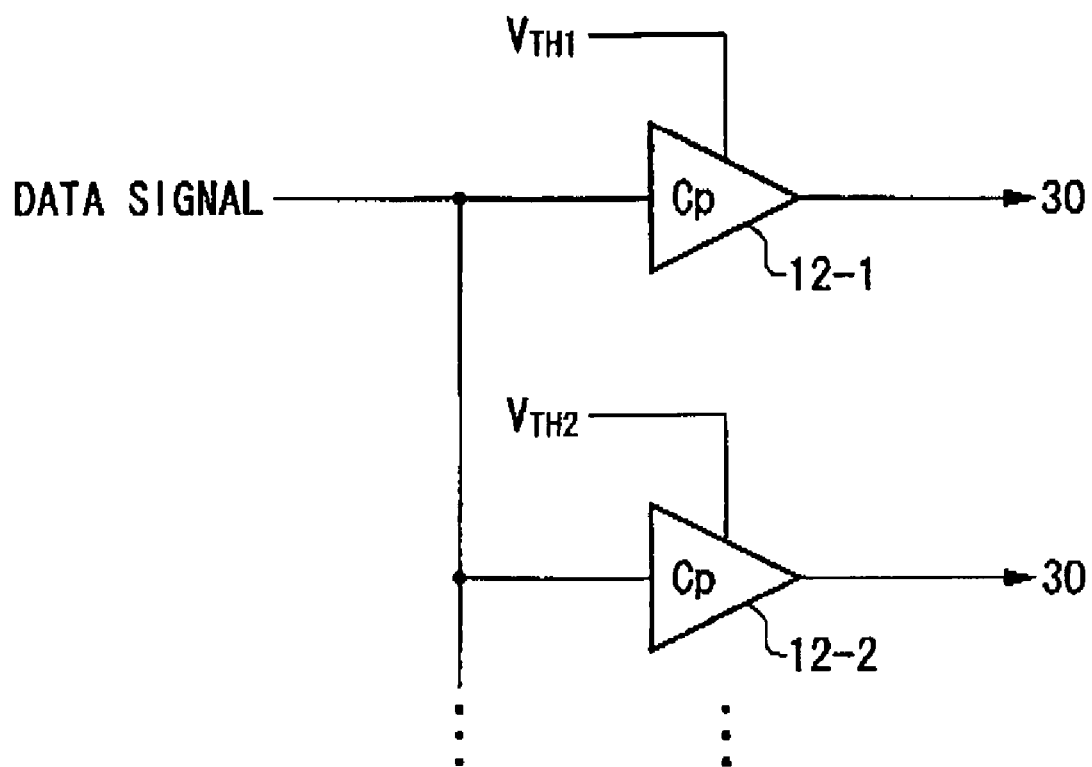
FIG. 13 shows an example of the configuration of the AD converter 10.

FIG. 13 shows an example of the configuration of the AD converter 10. The AD converter 10 relating to the embodiment of the invention includes therein one or more comparators 12, which receive the data signal in parallel. Here, each of the comparators 12 compares the level of the data signal with a different reference level. With such a configuration, the AD converter 10 functions as a 1-bit converter when having one comparator 12 therein, and as a multiple-bit converter when having a plurality of comparators 12 therein.

Figure 14:
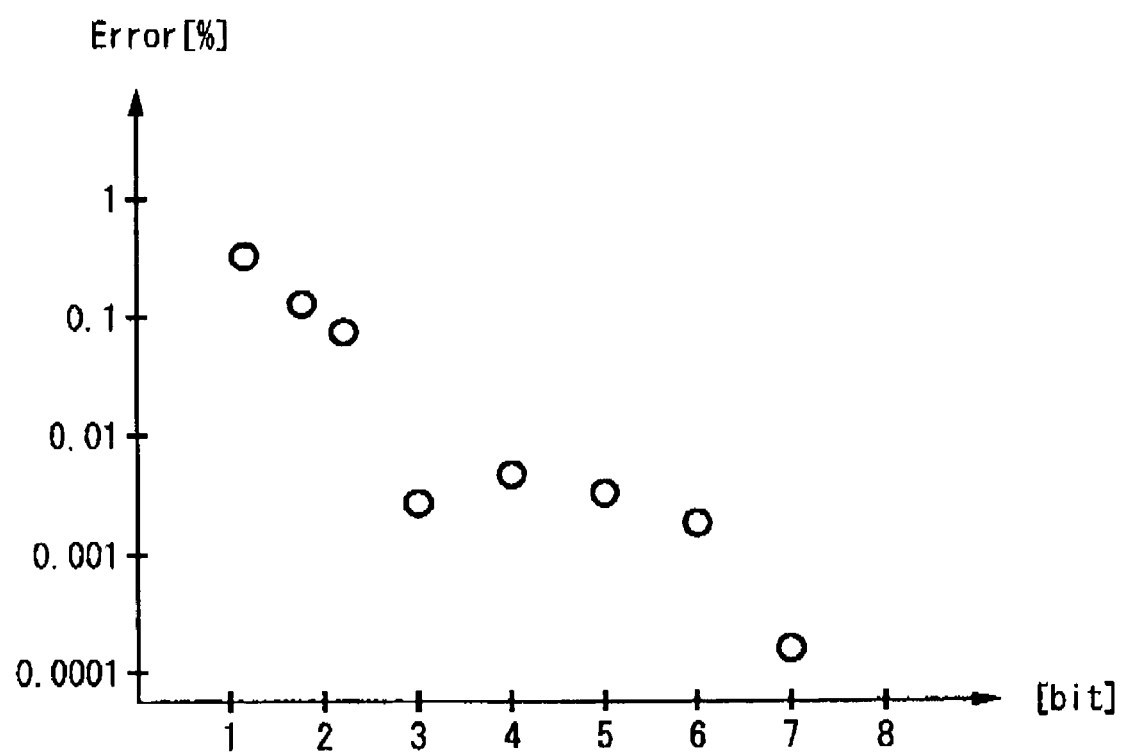
FIG. 14 shows an example of how the number of bits of the AD converter 10 is related to jitter measurement errors of the jitter measurement apparatus 100.

FIG. 14 shows an example of how the number of bits of the AD converter 10 is related to the jitter measurement error by the jitter measurement apparatus 100. In FIG. 14, the measurement error (the vertical axis) is plotted as a function of the number of bits of the AD 10 (the horizontal axis) converter. Here, it should be noted that FIG. 14 shows the measurement error by the jitter measurement apparatus 100 illustrated with reference to FIG. 1, and that the measurement error is calculated by using the measurement result obtained when the AD converter 10 is an 8-bit converter as expected value.

Here, the measurement error is observed by setting the number of bits of the AD converter 10 at 1, 1.6, 2, 3, 4, 5, 6 and 7. As indicated by FIG. 14, the measurement error is 1% or less even when the number of bits of the AD converter 10 is one. This would mean that the jitter measurement apparatus 100 can measure the jitter of the data signal with sufficient accuracy.

Figure 15:
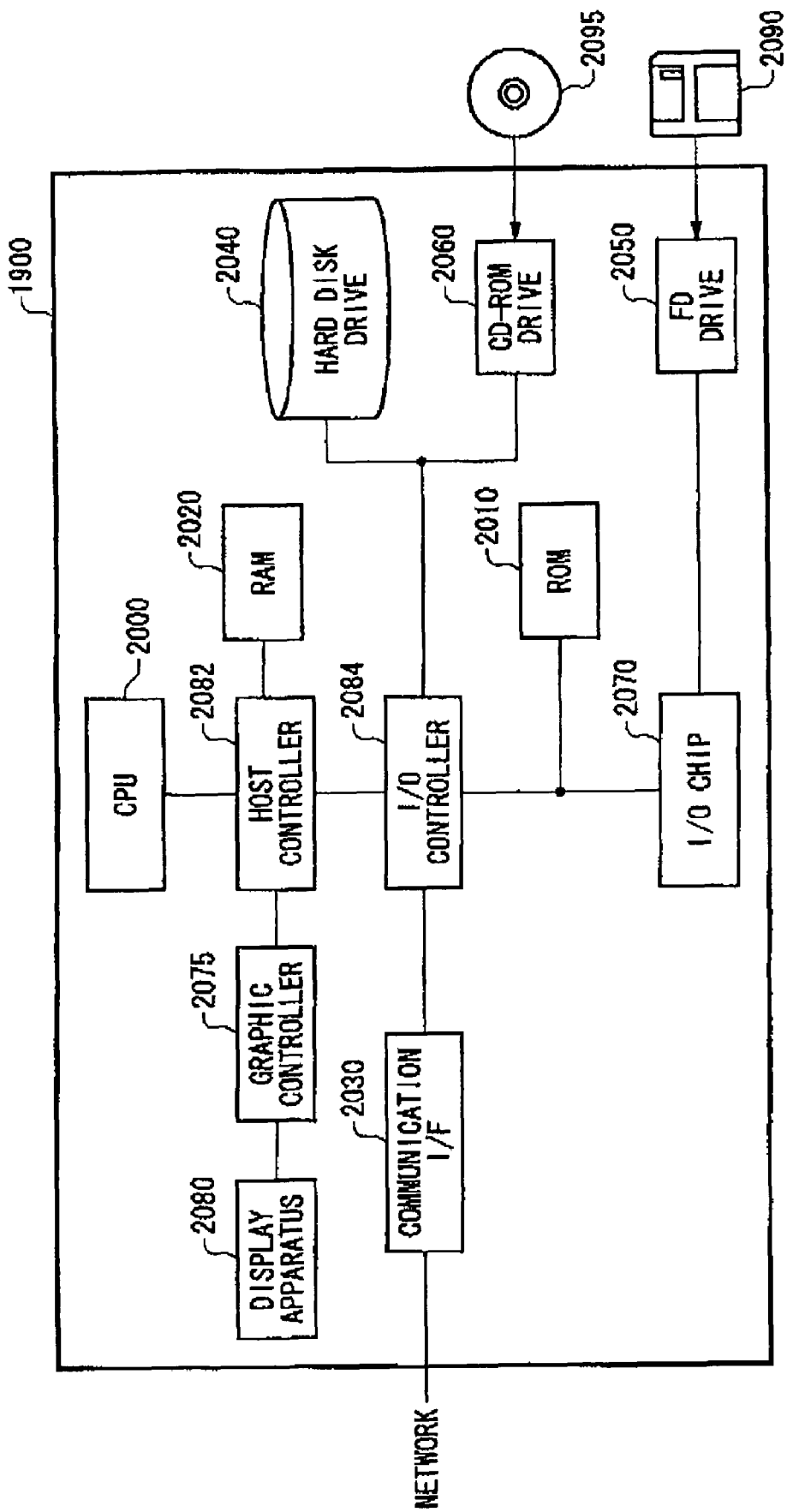
FIG. 15 shows an example of the hardware configuration of a computer 1900.

FIG. 15 shows an example of the hardware configuration of a computer 1900. The computer 1900 controls any one of the jitter measurement apparatuses 100 illustrated with reference to FIGS. 1 to 14, on the basis of a program provided thereto. As an alternative, the computer 1900 may function as at least one of the signal converting section 20, the analytic signal generating section 30, and the jitter measuring section 40 illustrated with reference to FIGS. 1 to 14.

When the computer 1900 controls the jitter measurement apparatus 100, the program causes the jitter measurement apparatus 100 to function as one of the jitter measurement apparatuses 100 illustrated with reference to FIGS. 1, 9, 12A and 12B.

When the computer 1900 functions as at least one of the signal converting section 20, the analytic signal generating section 30, and the jitter measuring section 40, the program causes the computer 1900 to function as at least one of the signal converting section 20, the analytic signal generating section 30, and the jitter measuring section 40 of the jitter measurement apparatus 100, and causes an external apparatus to function as other constituents of the jitter measurement apparatus 100.

The computer 1900 relating to this embodiment includes therein a CPU surrounding section, an input and output section, and a legacy input and output section. The CPU surrounding section includes therein a CPU 2000, a RAM 2020, a graphic controller 2075, and a display apparatus 2080 which are connected to each other by means of a host controller 2082. The input and output section includes therein a communication interface 2030, a hard disk drive 2040, and a CD-ROM drive 2060 which are connected to the host controller 2082 by means of an input and output controller 2084. The legacy input and output section includes therein a ROM 2010, a flexible disc drive 2050, and an input and output chip 2070 which are connected to the input and output controller 2084.

The host controller 2082 connects the RAM 2020 with the CPU 2000 and the graphic controller 2075 which access the RAM 2020 at a high transmission rate. The CPU 2000 operates on the basis of the programs stored on the ROM 2010 and RAM 2020, to control other sections. The graphic controller 2075 obtains image data generated by the CPU 2000 or the like on a frame buffer within the RAM 2020, and causes the obtained image data to be displayed on the display apparatus 2080. As an alternative, the graphic controller 2075 may include therein a frame buffer for storing image data generated by the CPU 2000 or the like.

The input and output controller 2084 connects, to the host controller 2082, the communication interface 2030 which is a relatively high-speed input and output apparatus, the hard disk drive 2040 and the CD-ROM drive 2060. The communication interface 2030 is in communication with another apparatus via the network. The hard disk drive 2040 stores thereon programs and data to be used by the CPU 2000 in the computer 1900. The CD-ROM drive 2060 reads programs or data from a CD-ROM 2095, and provides the read programs or data to the hard disk drive 2040 via the RAM 2020.

In addition, the input and output controller 2084 is connected to the ROM 2010, the flexible disc drive 2050, and the input and output chip 2070. Here, the flexible disc drive 2050 and input and output chip 2070 are relatively low-speed input and output apparatuses. The ROM 2010 stores thereon a boot program to be executed by the computer 1900 at the time of start-up, and a program depending on the hardware of the computer 1900, for example, The flexible disc drive 2050 reads programs or data from a flexible disc 2090, and provides the read programs or data to the hard disk drive 2040 via the RAM 2020. The input and output chip 2070 provides connection with a variety of input and output apparatuses via the flexible disc drive 2050, a parallel port, a serial port, a keyboard port, a mouse port and the like.

A program, which is provided to the bard disk drive 2040 via the RAM 2020, is supplied by a user in a state of being stored in a recording medium such as the flexible disc 2090, the CD-ROM 2095 and an IC card. The program is read out of the recording medium, installed within the hard disk drive 2040 in the computer 1900 via the RAM 2020, and executed by the CPU 2000.

The program is installed in the computer 1900. The program may cause the computer 1900 to control the jitter measurement apparatus 100 by being accessed by the CPU 2000 or the like. As an alternative, the program may cause the computer 1900 to function as at least one of the signal converting section 20, the analytic signal generating section 30, and the jitter measuring section 40.

The program may be stored on an external computer-readable medium. Such a recording medium may be constituted by an optical recording medium such as a DVD and a CD, a magnetic optical recording medium such as an MO, a tape medium, a semiconductor memory such as an IC card, or the like as well as the flexible disc 2090 and the CD-ROM 2095. As an alternative, the recording medium may be constituted by a recording apparatus such as a hard disk and a RAM provided in a server system connected to a dedicated communication network or the Internet, so that the program is provided to the computer 1900 via the network.

While the embodiments of the present invention have been described, the technical scope of the invention is not limited to the above described embodiments. It is apparent to persons skilled in the art that various alternations and improvements can be added to the above-described embodiments. It is also apparent from the scope of the claims that the embodiments added with such alternations or improvements can be included in the technical scope of the invention.

As clearly indicated by the above description, the embodiments of the present invention can measure a jitter of a data signal with high accuracy even when the data signal is digitized at a relatively low sampling rate.

What is claimed is:

1. A jitter measurement apparatus for measuring a jitter of a data signal having a substantially constant data rate, the jitter measurement apparatus comprising:
   a signal converting section that generates a clock signal based on the data signal, the clock signal retaining timings of data transition edges of the data signal at which a data value of the data signal transits and having edges whose cycle is substantially equal to the data rate;
   an analytic signal generating section that generates an analytic signal represented by a complex number from the clock signal; and
   a jitter measuring section that measures the jitter of the data signal based on the analytic signal.

2. The jitter measurement apparatus as set forth in claim 1, wherein
   the signal converting section is constructed and arranged such that when an interval between the data transition edges of the data signal is larger than a predetermined value determined in accordance with the data rate, the signal converting section generates the clock signal having therein one or more virtual edges provided in accordance with the timings of the data transition edges for interpolating the data transition edges.

3. The jitter measurement apparatus as set forth in claim 2, wherein
   the signal converting section generates the clock signal having therein the virtual edges provided at a substantially constant interval determined in accordance with the data rate in the interval between the data transition edges whose interval is larger than the predetermined value.

4. The jitter measurement apparatus as set forth in claim 1, further comprising an AD converter that inputs a digitized signal generated by digitizing a level of the data signal at a predetermined sampling rate into the signal converting section.

5. The jitter measurement apparatus as set forth in claim 2, wherein the signal converting section includes:
   a virtual edge calculating section that calculates timings of the virtual edges; and
   a virtual edge generating section that generates the virtual edges in accordance with the timings of the virtual edges, by inverting the data value of the data signal with respect to a substantially 50% level of the data signal.

6. The jitter measurement apparatus as set forth in claim 1, wherein the jitter measuring section includes:
   an instantaneous phase calculating section that calculates instantaneous phases of the clock signal based on the analytic signal;
   a phase noise calculating section that calculates an instantaneous phase noise of the clock signal by removing a linear component from the instantaneous phases of the clock signal; and
   a jitter calculating section that calculates the jitter of the data signal based on the instantaneous phase noise of the clock signal.

7. The jitter measurement apparatus as set forth in claim 6, wherein the jitter calculating section calculates the jitter of the data signal based on the instantaneous phase noise of the clock signal which corresponds to the timings of the data transition edges of the data signal.

8. A jitter measurement apparatus for measuring a jitter of a data signal having a substantially constant data rate, the jitter measurement apparatus comprising:
   a signal convening section that generates a clock signal based on the data signal, the clock signal retaining timings of data transition edges of the data signal at which a data value of the data signal transits and having edges whose cycle is substantially equal to the data rate;
   a Fourier transforming section that transforms the clock signal into a frequency-domain spectrum; and
   a jitter measuring section that measures the jitter of the data signal based on a ratio of a signal component to noise components of the clock signal in the frequency domain spectrum.

9. A jitter measurement method for measuring a jitter of a data signal having a substantially constant data rate, the jitter measurement method comprising:
   receiving the data signal from an electronic device;
   generating a clock signal based on the data signal, the clock signal retaining timings of data transition edges of the data signal at which a data value of the data signal transits and having edges whose cycle is substantially equal to the data rate;
   generating, based on the clock signal, an analytic signal represented by a complex number; and
   measuring the jitter of the data signal based on the analytic signal.

10. A jitter measurement method for measuring a jitter of a data signal having a substantially constant data rate, the jitter measurement method comprising:
    receiving the data signal from an electronic device;
    generating, based on the data signal, a clock signal, the clock signal maintaining timings of data transition edges of the data signal at which a data value of the data signal transits and having edges whose cycle is substantially equal to the data rate;
    transforming the clock signal into a frequency-domain spectrum; and
    measuring the jitter of the data signal based on a ratio of a signal component to a noise component of the clock signal in the frequency domain spectrum.

11. A tangible article of manufacture including a computer-readable medium storing thereon program code that if executed by a computing device causes the computing device to function as a jitter measurement apparatus for measuring a jitter of a data signal having a substantially constant data rate, the program causing the computer to function as:
    a signal convening section that generates a clock signal based on the data signal, the clock signal retaining timings of data transition edges of the data signal at which a data value of the data signal transits and having edges whose cycle is substantially equal to the data rate;
    an analytic signal generating section that generates an analytic signal represented by a complex number from the clock signal; and
    a jitter measuring section that measures the jitter of the data signal based on the analytic signal.

12. A tangible article of manufacture including a computer-readable medium storing thereon program code that if executed by a computing device causes the computing device to function as a jitter measurement apparatus for measuring a jitter of a data signal having a substantially constant data rate, the program causing the computing device to function as:
    a signal converting section that generates a clock signal based on the data signal the data signal into a clock signal, the clock signal retaining timings of data transition edges of the data signal at which a data value of the data signal transits and having edges whose cycle is substantially equal to the data rate;
    a Fourier transforming section that transforms the clock signal into a frequency-domain spectrum; and
    a jitter measuring section that measures the jitter of the data signal based on a ratio of a signal component to noise components of the clock signal in the frequency domain spectrum.

* * * * *